US006323104B1

(12) United States Patent
Trivedi

(10) Patent No.: US 6,323,104 B1
(45) Date of Patent: Nov. 27, 2001

(54) METHOD OF FORMING AN INTEGRATED CIRCUITRY ISOLATION TRENCH, METHOD OF FORMING INTEGRATED CIRCUITRY, AND INTEGRATED CIRCUITRY

(75) Inventor: Jigish D. Trivedi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/516,639

(22) Filed: Mar. 1, 2000

(51) Int. Cl.[7] .................................................. H01L 21/76
(52) U.S. Cl. ................................................................ 438/424
(58) Field of Search ..................................... 438/424, 427, 438/431, 437, FOR 227, 4, FOR 696, FOR 700

(56) References Cited

U.S. PATENT DOCUMENTS

| 5,677,231 | * | 10/1997 | Maniar et al. | 437/67 |
| 5,882,983 |   | 3/1999  | Gardner et al. | 438/424 |
| 6,090,661 |   | 7/2000  | Perng et al. | 438/248 |
| 6,093,619 | * | 7/2000  | Huang et al. | 438/400 |
| 6,165,871 | * | 12/2000 | Lim et al. | 438/437 |

* cited by examiner

Primary Examiner—David Nelms
Assistant Examiner—Quoc Huang

(74) Attorney, Agent, or Firm—Wells, St. John, Roberts, Gregory & Matkin P.S.

(57) ABSTRACT

A method of forming an integrated circuitry trench isolation region includes etching a first portion of an isolation trench into a semiconductor substrate. The first portion has laterally opposing sidewalls and a trench base extending therebetween. A second portion of the isolation trench is etched into the semiconductor substrate through only a portion of the first portion trench base. After the second etching, insulative trench isolation material is deposited to be received within the first and second portions of the isolation trench. In one implementation, a method of forming integrated circuitry includes forming a trench isolation region and an adjacent shallow junction region in a semiconductor substrate. The trench isolation region includes a sidewall adjacent the shallow junction region, the trench isolation region comprising at least two insulative trench isolation materials. A first of the materials is received over at least an outermost portion of the sidewall and a second of the materials is received adjacent the first, with the first material being received between the junction isolation region and the second material. A covering insulative material is formed over the trench isolation region and the shallow junction region. A contact opening is etched through the covering insulative material to the shallow junction region and the trench isolation region substantially selective to etch the covering insulative material relative to the first trench isolation material within the trench isolation region. Integrated circuitry independent of the method of fabrication is contemplated.

16 Claims, 9 Drawing Sheets

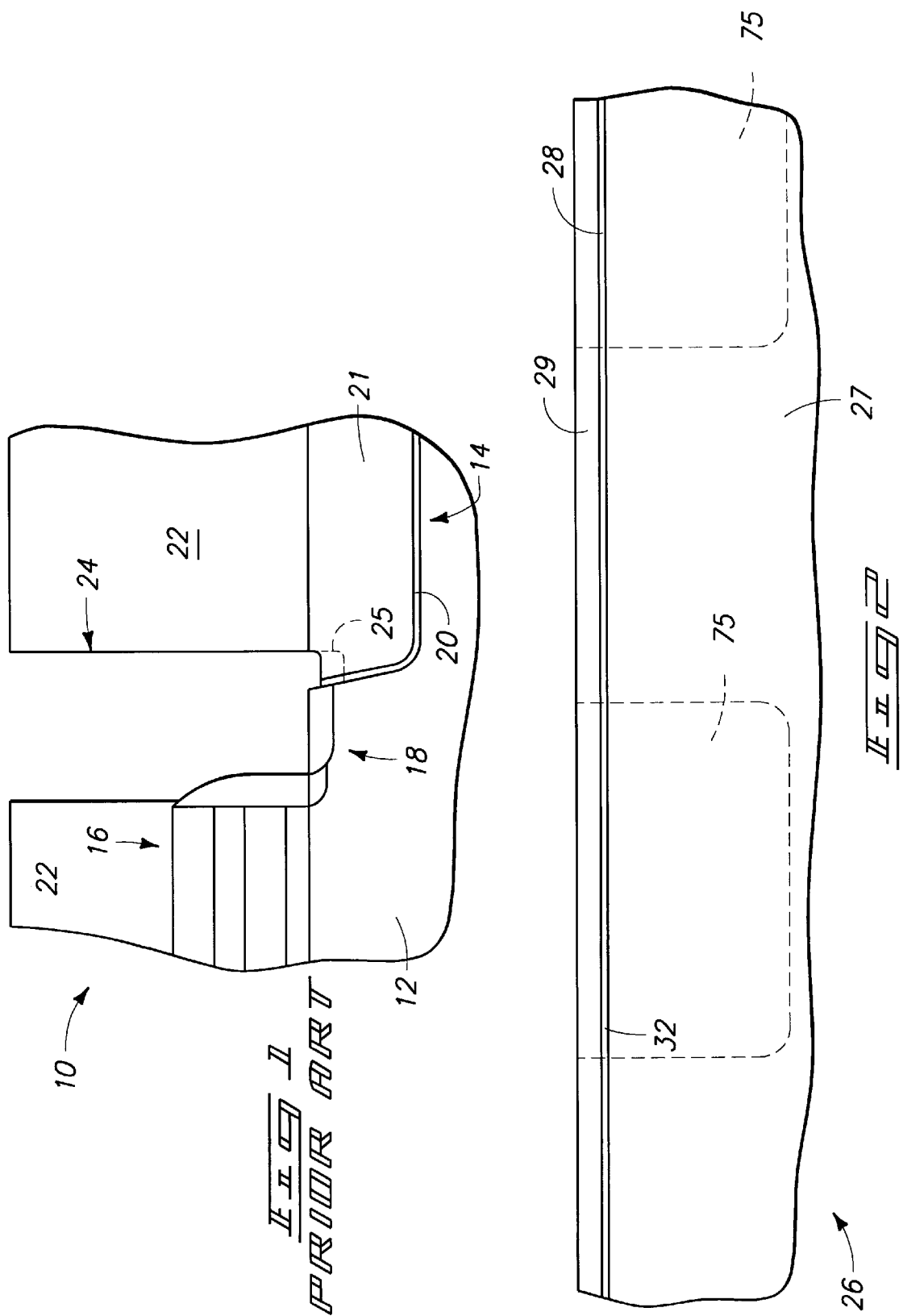

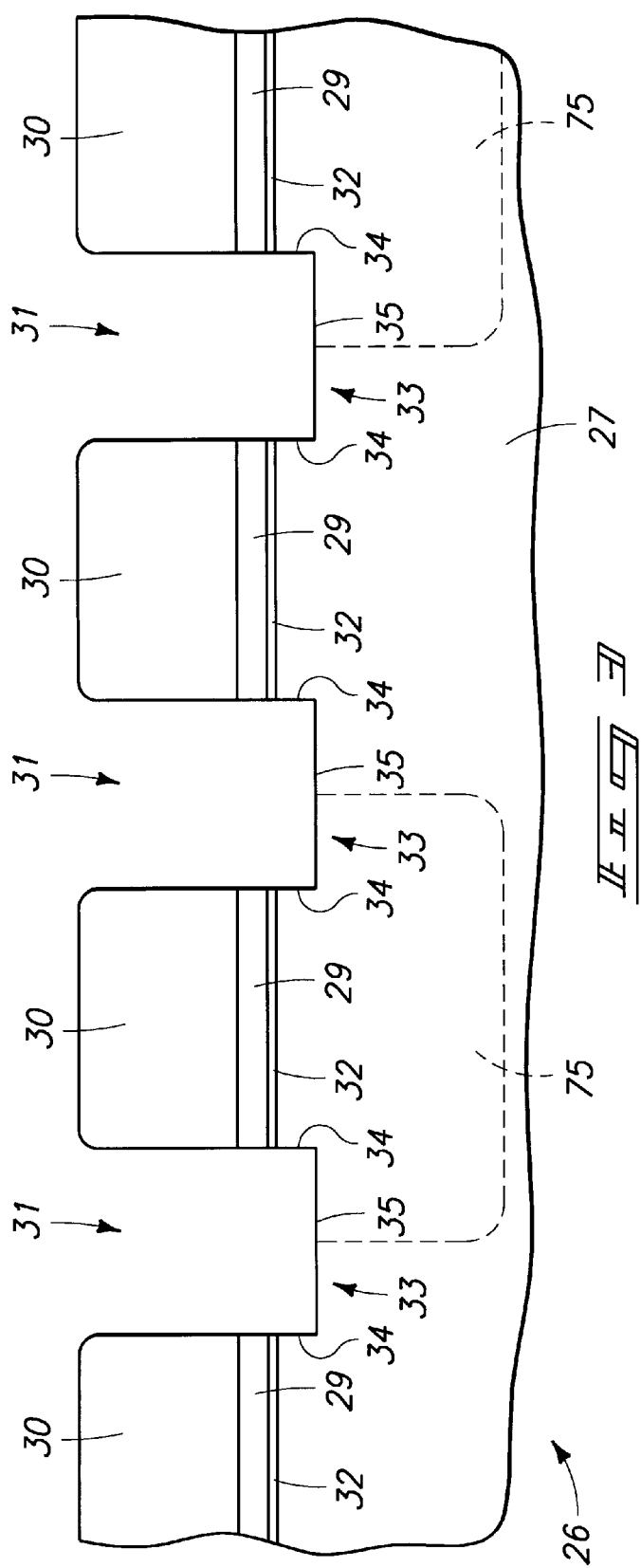

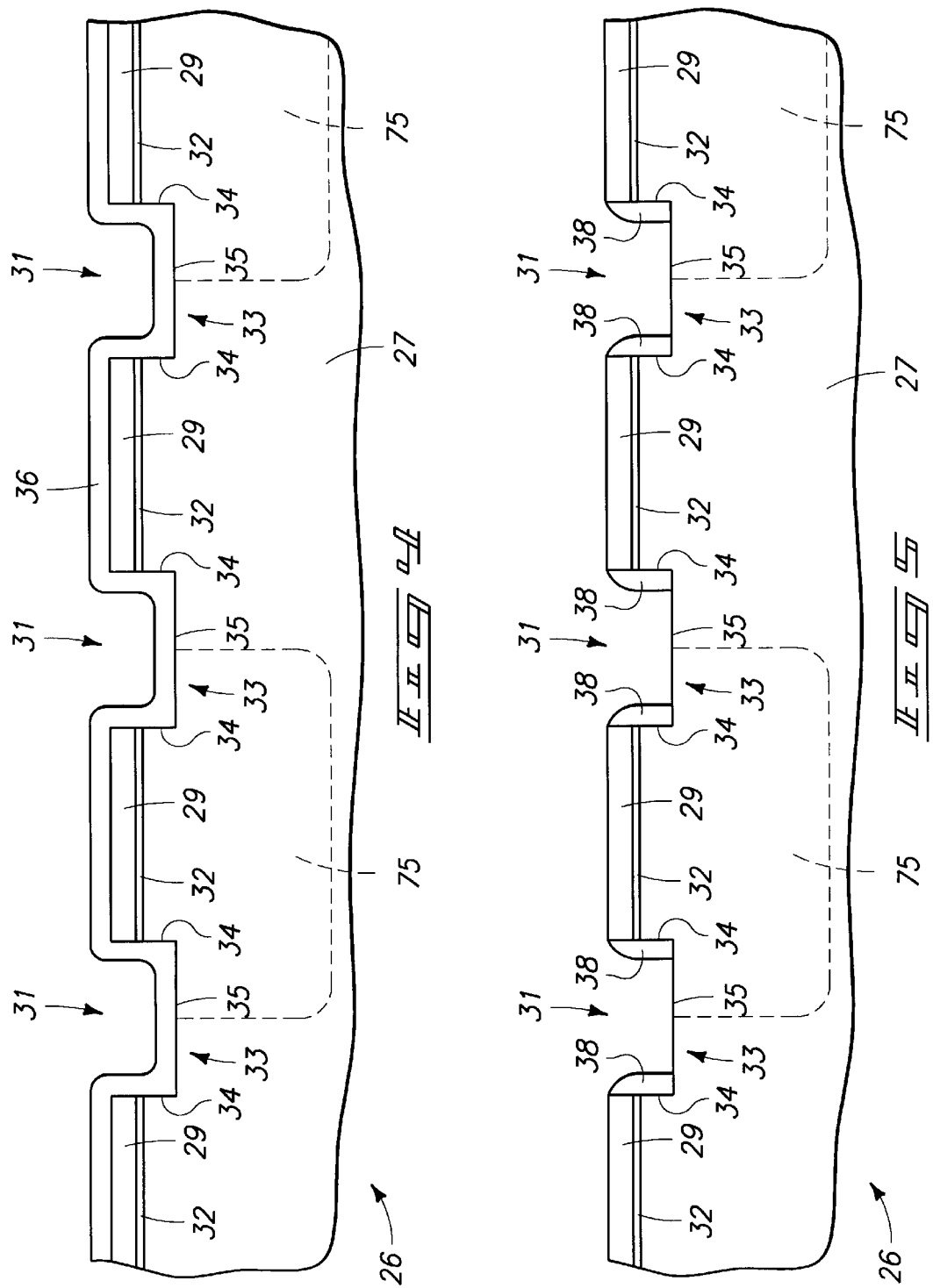

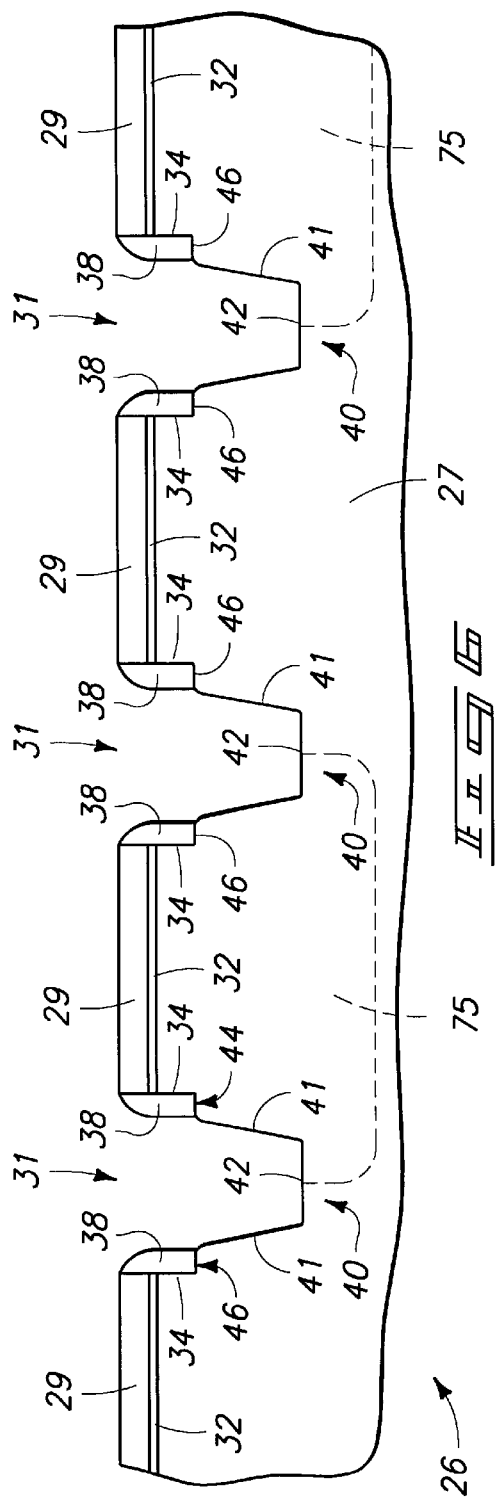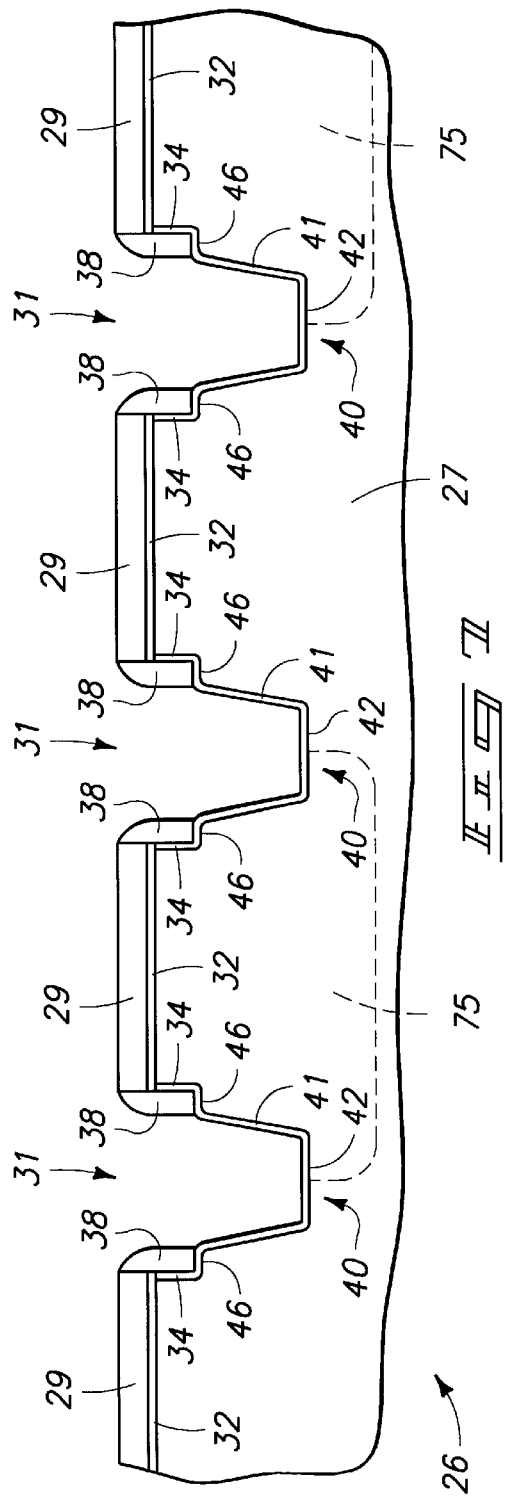

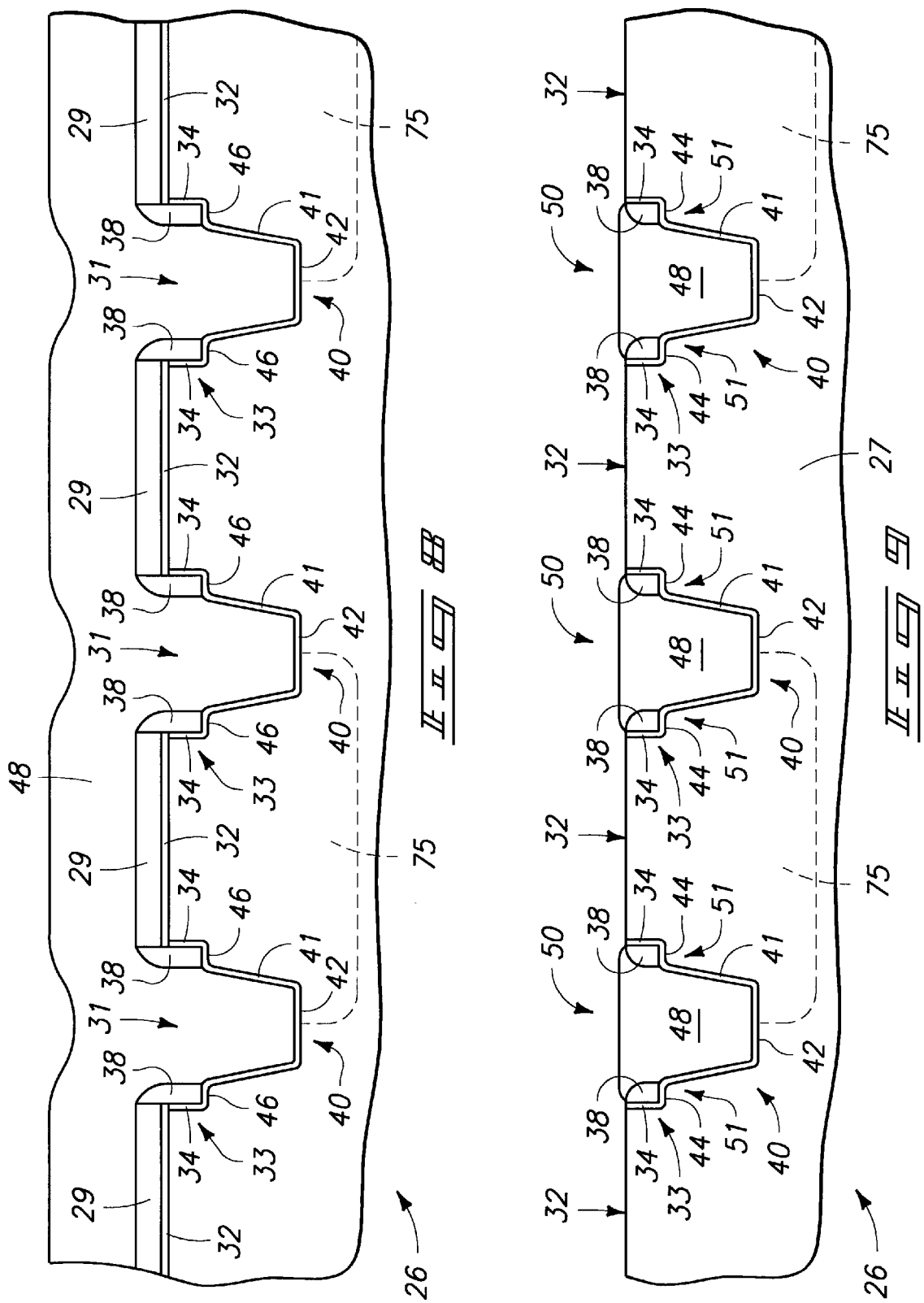

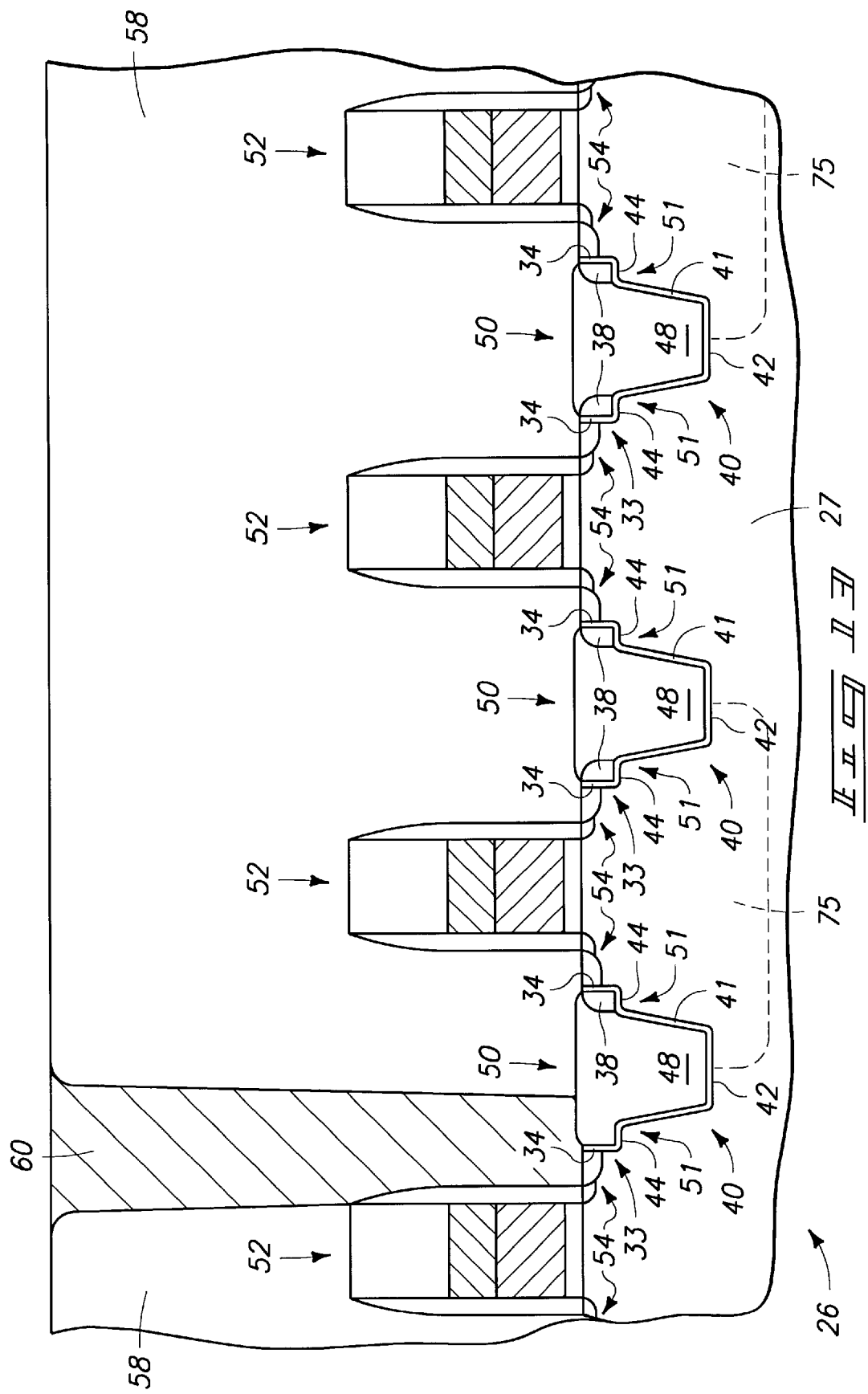

US 6,323,104 B1

METHOD OF FORMING AN INTEGRATED CIRCUITRY ISOLATION TRENCH, METHOD OF FORMING INTEGRATED CIRCUITRY, AND INTEGRATED CIRCUITRY

TECHNICAL FIELD

This invention relates to methods of forming integrated circuitry isolation trenches, to methods of forming integrated circuitry, and to integrated circuitry.

BACKGROUND OF THE INVENTION

Integrated circuitry is typically fabricated on and within semiconductor substrates, such as bulk monocrystalline silicon wafers. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Electrical components fabricated on substrates, and particularly bulk semiconductor wafers, are isolated from adjacent devices by insulating materials. One isolation technique uses trench isolation, whereby trenches are cut into a substrate and are subsequently filled with an insulating material. The insulating material is typically then planarized back to define isolated trenches filled with insulative isolation material. An example prior art construction and its associated problems are described with reference to FIG. 1. There illustrated is a semiconductor wafer fragment 10 comprising a bulk semiconductor wafer 12 having a trench isolation region 14 formed therein. A field effect transistor gate line 16 is formed over substrate 12, and conventionally comprises a gate dielectric layer, a conductively doped polysilicon region, an overlying high conductive silicide region, an insulative cap and a sidewall spacer which are not specifically designated with numerals. A source/drain diffusion region 18, also referred to as a junction, extends from proximate gate 16 to isolation trench 14.

Isolation trench 14 comprises a thermal silicon dioxide lining layer 20 and a greater volume insulating material 21 received therein. An example material 21 is undoped silicon dioxide deposited by high density plasma-enhanced decomposition of tetraethylorthosilicate (PETEOS). An insulative layer 22 is received over the substrate as illustrated. A contact opening 24 is formed through layer 22 and overlies shallow junction region 18 and shallow trench isolation region 14. In the context of this document, "shallow junction" means a depth less than or equal to about 1000 Angstroms. Unfortunately typically, material 22 also comprises an oxide material (i.e. borophosphosilicate glass) as do materials 21 and 20 within trench isolation region 14. Accordingly, typical anisotropic etching chemistries used to etch oxide insulative layer 22 also tend to etch oxide materials 20 and 21 of isolation region 14. This provides the illustrated degree of over-etch and accordingly sidewall exposure of the source/drain junction region 18. This can undesirably lead to excessive current leakage. If the contact opening etching is sufficient such that it is removed to elevationally lower than junction region 18, as shown by line 25, a fatal short to the substrate typically results.

One present prior art solution to the above problem comprises the deposition of a thin $Si_xN_yO_z$ layer prior to deposition of BPSG layer 22. The BPSG is then etched substantially selectively relative to the $Si_xN_yO_z$ layer using a contact opening mask. Then, the $Si_xN_yO_z$ layer is etched. Yet such $Si_xN_yO_z$ etching can also etch the trench oxides.

As device dimensions in integrated circuitry fabrication continue to get smaller, it is more likely that contact openings will overlie both shallow junction regions and adjacent isolation regions, thus more likely leading to contact leakage at best, and fatal substrate shorts at worst.

The invention was motivated in overcoming this particular problem, although the claims are in no way so limited, with the invention having applicability outside of its motivation in accordance with the accompanying claims as literally worded and appropriately interpreted in accordance with the Doctrine of Equivalents.

SUMMARY

The invention comprises methods of forming integrated circuitry isolation trenches, methods of forming integrated circuitry, and integrated circuitry independent of the method of fabrication. In one implementation, a method of forming an integrated circuitry trench isolation region includes etching a first portion of an isolation trench into a semiconductor substrate. The first portion has laterally opposing sidewalls and a trench base extending therebetween. A second portion of the isolation trench is etched into the semiconductor substrate through only a portion of the first portion trench base. After the second etching, insulative trench isolation material is deposited to be received within the first and second portions of the isolation trench.

In one implementation, a method of forming integrated circuitry includes forming a trench isolation region and an adjacent shallow junction region in a semiconductor substrate. The trench isolation region includes a sidewall adjacent the shallow junction region, the trench isolation region comprising at least two insulative trench isolation materials. A first of the materials is received over at least an outermost portion of the sidewall and a second of the materials is received adjacent the first, with the first material being received between the junction isolation region and the second material. A covering insulative material is formed over the trench isolation region and the shallow junction region. A contact opening is etched through the covering insulative material to the shallow junction region and the trench isolation region substantially selective to etch the covering insulative material relative to the first trench isolation material within the trench isolation region.

In one implementation, integrated circuitry includes a semiconductor substrate having a trench isolation region formed therein. The trench isolation region includes laterally opposing sidewalls and a trench base extending between the opposing sidewalls. The trench isolation region includes at least two insulative materials therein. One of the insulative materials is received between the other insulative material and semiconductor material of the semiconductor substrate. The one material is selected from the group consisting of $Si_xN_yO_z$, $Al_2O_3$, $Ta_2O_5$, nitrides such as silicon nitride and mixtures thereof. An integrated circuit device is received at least partially within the semiconductor substrate proximate the trench isolation region.

Other implementations are contemplated.

BRIEF DESCRIPTION OF THE DRAWINGS

Preferred embodiments of the invention are described below with reference to the following accompanying drawings.

FIG. 1 is a view of a prior art semiconductor wafer fragment described in the "Background" section above.

FIG. 2 is a view of a semiconductor wafer fragment in process in accordance with an aspect of the invention.

FIG. 3 is a view of the FIG. 2 wafer fragment at a processing step subsequent to that depicted by FIG. 2.

FIG. 4 is a view of the FIG. 2 wafer fragment at a processing step subsequent to that depicted by FIG. 3.

FIG. 5 is a view of the FIG. 2 wafer fragment at a processing step subsequent to that depicted by FIG. 4.

FIG. 6 is a view of the FIG. 2 wafer fragment at a processing step subsequent to that depicted by FIG. 5.

FIG. 7 is a view of the FIG. 2 wafer fragment at a processing step subsequent to that depicted by FIG. 6.

FIG. 8 is a view of the FIG. 2 wafer fragment at a processing step subsequent to that depicted by FIG. 7.

FIG. 9 is a view of the FIG. 2 wafer fragment at a processing step subsequent to that depicted by FIG. 8.

FIG. 13 is a view of an alternate embodiment semiconductor wafer fragment.

DETAILED DESCRIPTION OF THE PREFERRED EMBODIMENTS

Figure 10:
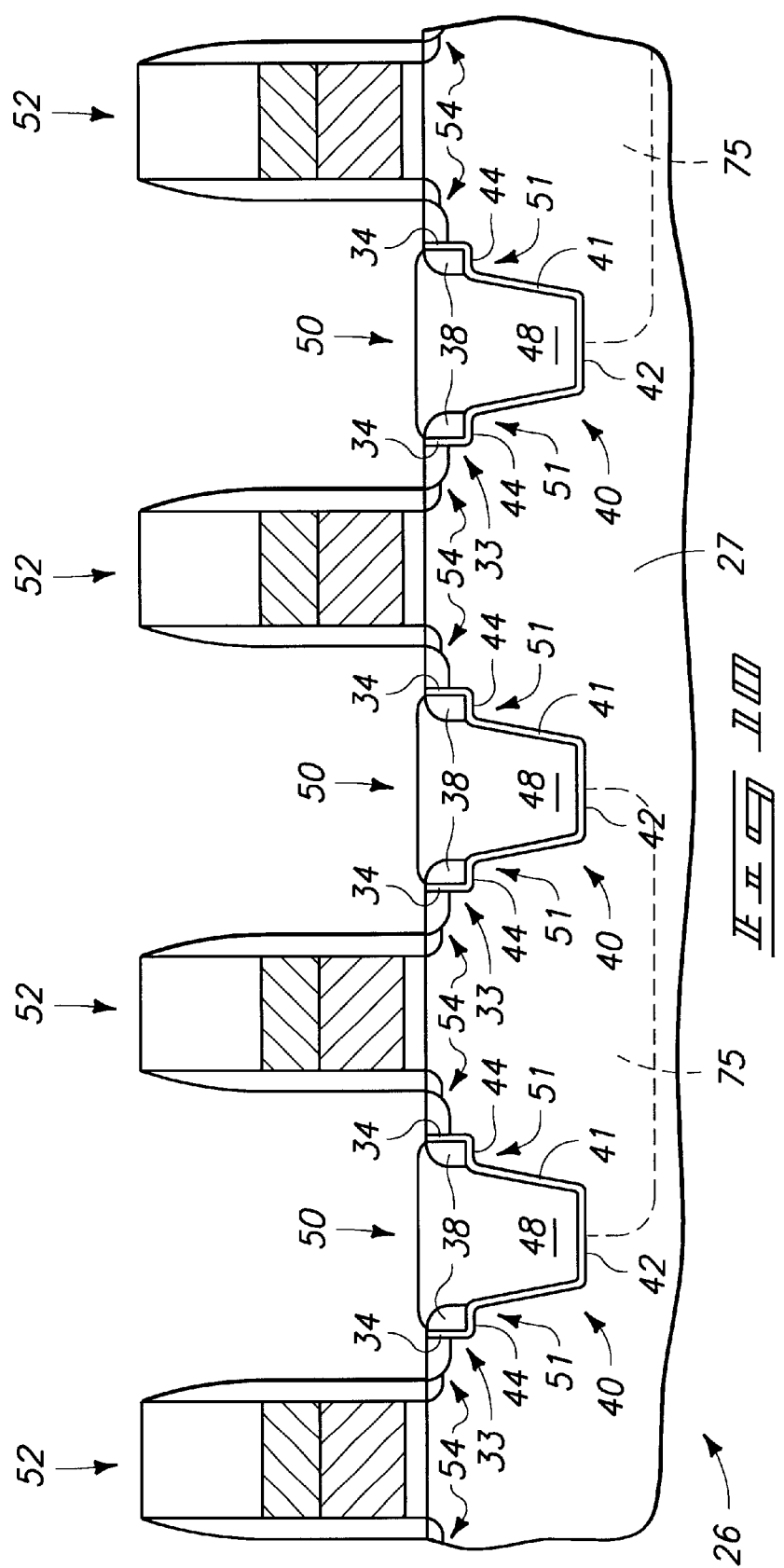
FIG. 10 is a view of the FIG. 2 wafer fragment at a processing step subsequent to that depicted by FIG. 9.

This disclosure of the invention is submitted in furtherance of the constitutional purposes of the U.S. Patent Laws "to promote the progress of science and useful arts" (Article 1, Section 8).

Referring to FIGS. 2 and 3, a semiconductor wafer fragment 26 is comprised of a bulk monocrystalline silicon substrate 27. N-wells 75 can be formed therein, as shown. For purposes of the continuing discussion, semiconductor substrate 27 comprises an outer surface 32. An oxide layer 28, such as silicon dioxide, is formed over bulk silicon substrate 27 to form a pad/protection oxide layer. Such could be formed by any technique, such as thermally oxidizing the outer silicon surface of substrate 27 in a steam ambient at 800° C–1150° C for from 1 minute to 120 minutes to form a substantially undoped silicon dioxide layer 28 to a thickness of from 40–200 Angstroms. A masking layer 29 (i.e. silicon nitride) is formed over thermal silicon dioxide layer 28, for example by chemical vapor deposition. A photoresist layer 30 (FIG. 3) is formed thereover and patterned as shown to provide openings 31 therein for ultimate formation of the isolation trenches.

Referring to FIG. 3, first portions 33 of isolation trenches are etched into semiconductor substrate 27. Respective first portions 33 have laterally opposing sidewalls 34 and a trench base 35 extending therebetween. First portion trench base 35 has a substantially straight portion formed substantially parallel with substrate outer surface 32, and as shown with such portion extending substantially entirely between first portion sidewalls 34. An example depth of base 35 from surface 32 is 1000 Angstroms. An example width for base 35 is 0.15 micron. An example etch chemistry for anisotropically etching includes $CF_4$, HBr, and $CH_2F_2$. Of course, other polymerizing gases can be used, i.e., $CHF_3$, etc.

Referring to FIG. 4, a first insulative trench isolation material 36 is deposited over the substrate and into trench first portion 33 to a depth insufficient to fill such first portion. An example thickness is from 50 Angstroms to 400 Angstroms, with from 100 Angstroms to 300 Angstroms being more preferred. Example and preferred materials include $Si_xN_yO_z$, $Al_2O_3$, $Ta_2O_5$, nitrides such as silicon nitride, and mixtures thereof. Preferably, "x" ranges from 0.39 to 0.65, "y" ranges from 0.02 to 0.56, and "z" from 0.05 to 0.33. Such layer in the preferred embodiment constitutes a masking layer, preferably an insulative masking layer, and remains as part of the integrated circuitry as finally completed, as will become apparent from the continuing discussion.

Referring to FIG. 5, insulative trench masking isolation material 36 is anisotropically etched effective to leave a pair of opposing anisotropically etched sidewall spacers 38 over at least a portion of first portion sidewalls 34 and over laterally opposed portions of first portion trench base 35. An example etch chemistry for achieving the illustrated etch where the masking layer predominately comprises $Si_xN_yO_z$ includes $CF_4$, $CHF_3$ and $CH_2F_2$. An example etching chemistry where the masking layer predominately comprises $Al_2O_3$ includes $CF_4$, $CHF_3$, Cl, $CH_2F_2$. An example chemistry where the masking layer comprises $Ta_2O_5$ includes $CF_4$, $CHF_3$, Cl, and $NF_3$. Such preferably results, in combination with the deposition thickness of layer 36 from which spacers 38 are formed, to form spacers 38 to have a width thickness of from about 50 Angstroms to about 400 Angstroms, and more preferably from about 150 Angstroms to about 300 Angstroms. Such etching further preferably exposes first portion trench base 35, as shown.

Referring to FIG. 6, and with sidewall spacers 38 in place, a second portion 40 of the respective isolation trenches is etched into semiconductor substrate 27 through first portion trench bases 35 laterally inward of spacers 38. Such is typically and preferably etched to a greater thickness than first portion 33, with an example second portion etch step being 2500 Angstroms of substrate 27. Second trench portions 40 comprise laterally opposind sidewalls 41 and a second portion base 42 extending therebetween. Preferably, the first and second etchings form both first portion sidewalls 34 and second portion sidewalls 41 to be substantially straight and to taper laterally inward toward one another into the substrate.

Such spacer 38 formation provides but one example of masking only a portion of first portion trench base 35 and etching a second trench portion into the substrate through an unmasked portion of first portion trench base 35. Other masking techniques and materials might also be utilized, such as and by way of example only utilizing photoresist and conventional masking techniques. As shown, unmasked portion of trench base 35 is preferably centrally located between first portion trench sidewalls 34, with the masking also masking at least a majority, and preferably substantially all, of at least one of first portion trench sidewalls 34. Preferably as shown, the masking also masks at least a majority, and preferably substantially all, of both first portion trench sidewalls 34.

Also, the figure description and the above-described masking, coupled with etching, constitutes but only one example etching of a second portion of the isolation trench into a semiconductor substrate through only a portion of the first portion trench base. Other existing, or yet-to-be-developed techniques, for accomplishing the same are also contemplated, for example etching or ablation targeting with a laser or some other technique. Regardless and preferably as shown and described, the portion of first portion trench base 35 through which second portion 40 is etched is centrally located between first portion sidewalls 34. Further, the portion of first portion trench base 35 through which second portion 40 is etched is preferably not adjacent either first portion trench sidewall 34.

Further as shown, such second portion etching forms at least one shelf 44, and preferably two shelves 44 as shown, for the respective trenches from first portion trench base 35 which is received elevationally outward of second portion base 42. Further, second portion trench base 42 includes at least some straight extending segment, in the preferred embodiment extending substantially entirely between walls 41. Shelves 44 are also preferably formed to be substantially straight and substantially parallel with second portion base 42, as shown. The depicted embodiment also discloses but one example where material (i.e. layer 36/spacers 38) is deposited over first portion sidewalls 34 prior to said second portion 40 etching.

Referring to FIG. 7, first portion trench sidewalls 34, shelf 44 and second portion sidewalls 41 are thermally oxidized in a suitable oxidizing atmosphere. An example atmosphere includes $H_2O$ vapor and/or and oxygen ambient in a furnace, by RTP or other means. Such will typically displace such sidewalls, base, and shelves into substrate 27 as shown, and form trench lining thermal oxide layer 46. Such thermal oxidizing is preferred, although optional. Further such might be conducted later or earlier (or both) in the example preferred embodiment.

Referring to FIG. 8, an insulative trench isolation material 48 is deposited within first and second trench portions 33 and 40. An example and preferred material is high density plasma deposited TEOS. Alternate materials, by way of example only such as silicon nitride, are also of course contemplated. Accordingly in the illustrated and preferred embodiment, material (i.e. 36/38) is deposited over first portion sidewalls 34 prior to depositing of insulative trench isolation material 48 to within the first and second portions of the isolation trench. Further, insulative trench isolation material 48 is deposited over anisotropically etched spacers 38.

Referring to FIG. 9, insulative material 48 and masking layer 29 have been planarized back outwardly of substrate 27, for example by chemical mechanical polishing. Preferred thermal pad oxide layer 28 has been etched (i.e., using an anhydrous HF vapor having less than 0.1% water, $N_2$, and $CH_3OH$ at a temperature of 120° C. and a pressure of 100 Torr, or using a wet strip using 100:1 HF) to outwardly expose substrate surface 32.

Such provides but one example of forming an isolation trench region 50 comprising a first portion 33 and a second portion 40. Trench isolation region 50 comprises laterally opposing sidewalls 51 which define at least two different trench isolation region widths and a trench base 42 extending between opposing sidewalls 51. At least one of the sidewalls, and preferably both as shown, comprises a shelf 44 formed therein which is received elevationally above trench base 42. Isolation region 50 comprises at least two different isolation materials which in the preferred embodiment has one of such materials (i.e. material 38) received over at least one shelf 44 and not over base 42.

Further and regardless, one of the insulative materials (i.e. material 38) is received between the other insulative material (i.e. material 48) and material of semiconductor substrate 27 adjacent isolation region 50. The one material in the preferred implementation is selected from the group consisting of $Si_xN_yO_z$, $Al_xO_3$, $Ta_2O_5$, nitrides such as silicon nitride, and mixtures thereof. In the illustrated and preferred embodiment, the integrated circuitry further comprises a silicon dioxide layer, such as layer 46, received between the one insulative material (i.e. spacers 38) and semiconductive material of semiconductor substrate 27. Further, trench isolation region 50 comprises at least two insulative materials therein, with at least one of the insulative materials being received over the shelf and between the other insulative material and semiconductive material of the semiconductor substrate.

Referring to FIG. 10, field effect transistor gates 52 and associated shallow junction regions 54 are formed over substrate 27, with shallow junction regions 54 being received between gate constructions 52 and field isolation regions 50. Thus, shallow junction regions 54 can also be considered as being formed adjacent first trench portions 33. Thus, a first of the insulative materials received within the isolation region 50 (i.e., material 38) is received over at least an outermost portion of sidewall 51 and a second of the materials (i.e. material 48) is received adjacent the first, with the first material being received between junction isolation region 54 and second material 48. Accordingly and most preferably, first trench isolation material 38 extends along outermost portion of sidewall 51/34 to elevationally lower than shallow junction region 54. Further preferably as shown, shelves 44 are received elevationally lower than shallow junction regions 54. Further, the transistor formed in part by gate construction 52 and shallow junction regions 54 comprises but one example integrated circuitry device received at least partially within semiconductor substrate 27 proximate trench isolation region 50.

Figure 11:
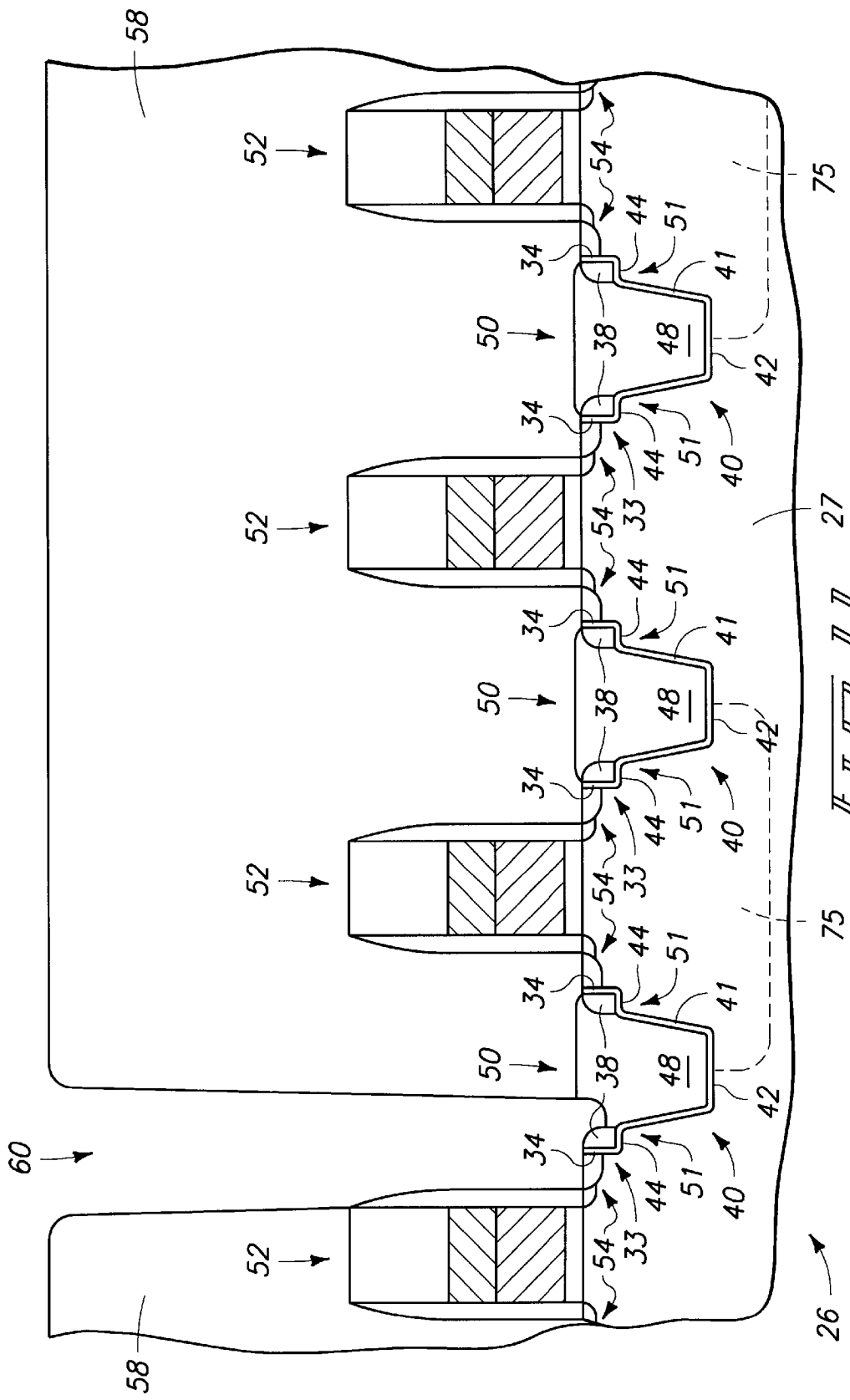
FIG. 11 is a view of the FIG. 2 wafer fragment at a processing step subsequent to that depicted by FIG. 10.

Referring to FIG. 11, a covering insulative material 58 is formed over trench isolation region 50 and shallow junction region 54. An antireflective coating or etch stop layer might also constitute a part of or be used over material 58. A preferred and typical material is BPSG, thus in the preferred embodiment resulting in second trench isolation material 48 and the covering insulative material comprising $SiO_2$. A contact opening 60 is shown as being etched through covering insulative material 58 to shallow junction region 54 and trench isolation region 50 substantially selective to etch the covering insulative material 58 relative to the first insulative trench isolation material 38 within trench isolation region 50. Where material 58 comprises BPSG, material 48 high density plasma deposited $SiO_2$, and spacers 38 $Si_xN_yO_z$, an example and preferred etching chemistry and parameters include $CF_4$ at 50 sccm, $CHF_3$ at 50 sccm, power at 700 W, pressure at 200 mTorr, followed by etching with a mixture of $CF_4$ and HBr. Typically and as shown, such etching will etch second trench isolation material 48 to at least some degree.

Figure 12:
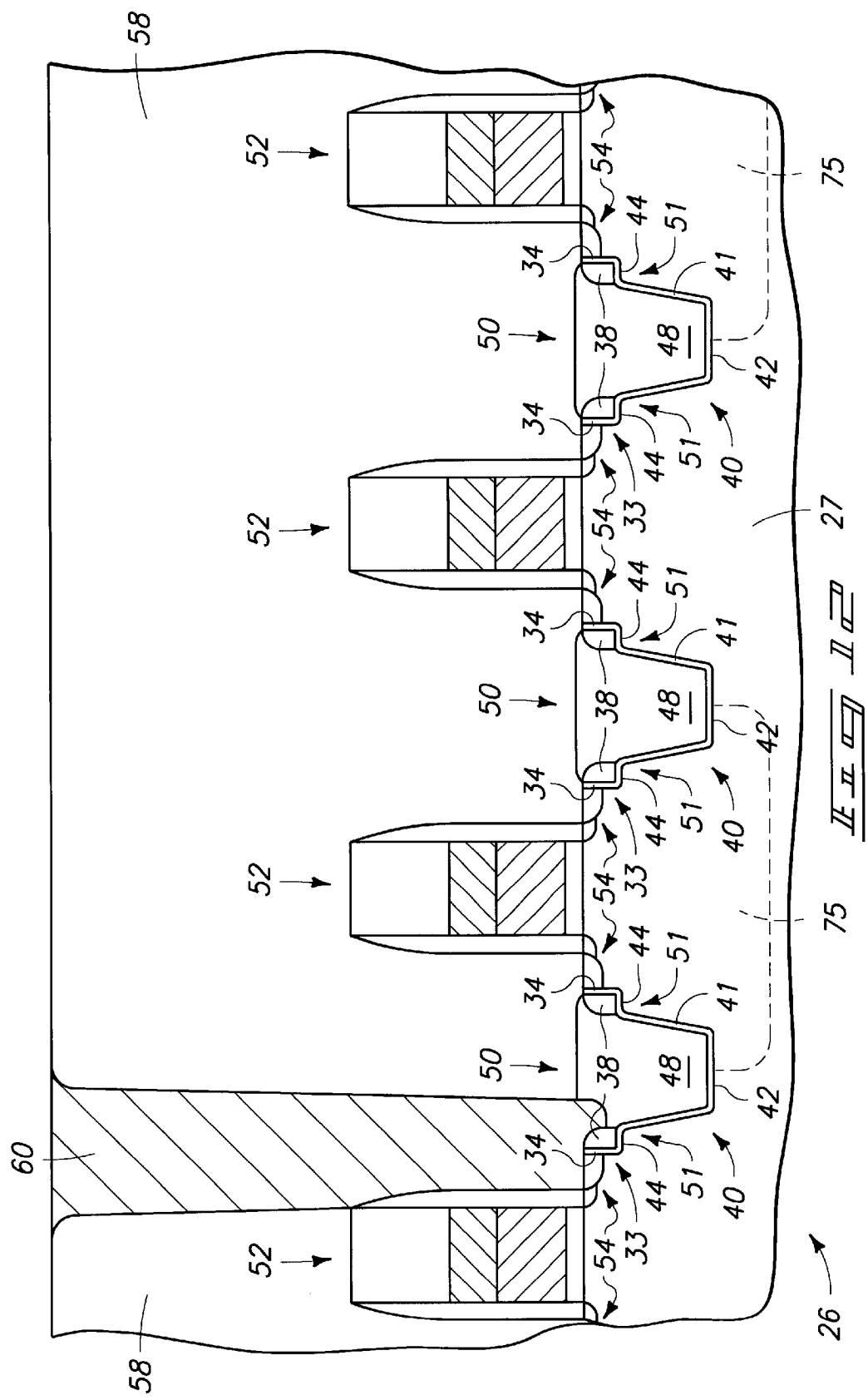
FIG. 12 is a view of the FIG. 2 wafer fragment at a processing step subsequent to that depicted by FIG. 11.

Referring to FIG. 12, some suitable conductive plugging material 61 (i.e., TiN, W, poly or mixtures thereof) is deposited to fill contact opening 60, and thus form a conductive contact received over shallow junction region 54 in electrical connection therewith and received within trench isolation region 50. The one insulative material 38 is received between the other insulative material 48 and shallow junction region 54.

The above isolation trench construction can also provide a slight advantage by increasing breakdown voltage. Specifically, one issue of concern is that of breakdown voltage occurring between the typical n+ shallow diffusion region 54 and the typical adjacent n-well 75. This is in part a function of the total area or length along the trench sidewall from the shallow junction region to the n-well, as this is where the parasitic channel/transistor is undesirably formed upon a certain breakdown voltage existing between regions 75 and 54. The preferred depicted construction results in increase of such area/distance, and can thereby correspondingly increase the breakdown voltage. Accordingly, the invention contemplates such methods of fabrication and constructions as claimed which in some instances is independent of whether material 38 is received intermediate semiconductor material of substrate 27 and insulative material 48. FIG. 13 depicts such an exemplary, but less preferred, construction whereby spacers 38 were removed prior to depositing insulative isolation material 48, and thus do not appear in the finished integrated circuitry construction. Further, such also exemplifies plugging material 61 not extending to within isolation regions 50a.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming integrated circuitry comprising:

forming a pad oxide layer over a bulk semiconductor substrate and a masking layer over the pad oxide layer;

after forming the pad oxide layer and the masking layer, etching a first portion of an isolation trench into the semiconductor substrate, the first portion being received entirely within the semiconductor substrate and having laterally opposing sidewalls and a trench base extending therebetween;

depositing a first insulative trench isolation material over the substrate and into the trench first portion to a depth insufficient to fill said first portion received entirely within the semiconductor substrate, the first insulative trench material comprising a material selected from the group consisting of $Si_xN_yO_z$, $Al_2O_3$ and $Ta_2O_5$;

anisotropically etching the insulative trench isolation material effective to leave a pair of opposing anisotropically etched sidewall spacers over at least a portion of the first portion sidewalls and over laterally opposed portions the first portion trench base;

with the pair of sidewall spacers in place, etching a second portion of the isolation trench into the semiconductor substrate through the first portion trench base laterally inward of the spacers;

depositing a second insulative trench isolation material within the first and second portions of the isolation trench and forming an isolation trench region comprising the first and second portions;

planarize polishing the second insulative trench isolation material, the opposing anisotropically etched spacers and the masking material, and leaving an uppermost surface of the anisotropically etched spacers elevationally flush with an uppermost surface of the bulk semiconductor substrate immediately thereadjacent;

after depositing the second insulative trench isolation material, forming a shallow junction region within the semiconductor substrate adjacent the first trench portion;

forming a covering insulative material over the trench isolation region and the shallow junction region; and etching a contact opening through the covering insulative material to the shallow junction region and the trench isolation region substantially selective to etch the covering insulative material relative to the first insulative trench isolation material within the trench isolation region.

2. The method of claim 1 wherein the first trench isolation material extends along the outermost portion of the sidewall to elevationally lower than the shallow junction region.

3. The method of claim 1 wherein the semiconductor substrate comprises a monocrystalline silicon wafer.

4. The method of claim 1 wherein the portion of the first portion trench base through which the second portion is etched is centrally located between the first portion trench sidewalls.

5. The method of claim 1 wherein the portion of the first portion trench base through which the second portion is etched is not adjacent either first portion trench sidewall.

6. The method of claim 1 wherein the second portion etching forms second portion trench sidewalls and a second portion base extending therebetween, and forms at least one shelf from the first portion trench base which is received elevationally outwardly of the second portion base.

7. The method of claim 1 wherein the second portion base includes a straight extending segment, and the shelf is substantially straight and substantially parallel with the second portion base.

8. The method of claim 1 wherein the second portion etching forms second portion trench sidewalls and a second portion base extending therebetween, and forms at least two shelves received elevationally outwardly of the second portion base.

9. The method of claim 1 comprising thermally oxidizing the first portion trench sidewalls in an oxidizing atmosphere.

10. The method of claim 1 wherein the second portion has laterally opposing sidewalls, and comprising thermally oxidizing the first portion trench sidewalls and the second portion trench sidewalls in an oxidizing atmosphere.

11. The method of claim 1 wherein the first insulative trench material comprises $Si_xN_yO_z$.

12. The method of claim 1 wherein the first insulative trench material comprises $Al_2O_3$.

13. The method of claim 1 wherein the first insulative trench material comprises $Ta_2O_5$.

14. The method of claim 1, wherein the first trench isolation material comprises $Si_xN_yO_z$.

15. The method of claim 1, wherein the first trench isolation material comprises $Al_2O_3$.

16. The method of claim 1, wherein the first trench isolation material comprises $Ta_2O_5$.

* * * * *

UNITED STATES PATENT AND TRADEMARK OFFICE
CERTIFICATE OF CORRECTION

PATENT NO.  : 6,323,104 B1
DATED       : November 27, 2001
INVENTOR(S) : Jigish D. Trivedi It is certified that error appears in the above-identified patent and that said Letters Patent is hereby corrected as shown below:

Column 4,
Line 30, insert after: Such etching further preferably exposes first portion trench base 35, as shown. -- Further, such anisotropic etching preferably leaves the spacers over at least a majority of first portion trench sidewalls 34, and preferably over substantially all of first portion trench sidewalls 34 as shown. --
Line 38, replace "laterally opposind sidewalls 41" with -- laterally opposing sidewalls --

Column 5,
Line 66, replace "of $Si_xN_yO_z$, $Al_xO_3$, $Ta_2O_5$, nitrides" with -- of $Si_xN_yO_z$, $Al_2O_3$, $Ta_2O_5$, nitrides --

Signed and Sealed this

Twentieth Day of August, 2002

Attest:

JAMES E. ROGAN
Attesting Officer　　　Director of the United States Patent and Trademark Office